United States Patent
Kobayashi et al.

(10) Patent No.: US 6,805,743 B2
(45) Date of Patent: Oct. 19, 2004

(54) METHOD FOR MANUFACTURING SINGLE-CRYSTAL-SILICON WAFERS

(75) Inventors: Norihiro Kobayashi, Gunma (JP);
Masaro Tamatsuka, Gunma (JP);
Takatoshi Nagoya, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/333,970

(22) PCT Filed: Jul. 19, 2001

(86) PCT No.: PCT/JP01/06274

§ 371 (c)(1),
(2), (4) Date: Jan. 24, 2003

(87) PCT Pub. No.: WO02/11196

PCT Pub. Date: Feb. 7, 2002

(65) Prior Publication Data

US 2003/0164139 A1 Sep. 4, 2003

(30) Foreign Application Priority Data

Jul. 28, 2000 (JP) ........................... 2000-229522

(51) Int. Cl.⁷ ..................... C30B 25/02; C30B 25/04
(52) U.S. Cl. .................................... 117/89; 117/84
(58) Field of Search ....................... 117/84, 89

(56) References Cited

U.S. PATENT DOCUMENTS 6,264,906 B1 * 7/2001 Aihara et al. ............. 423/328.2
6,336,968 B1 * 1/2002 Falster ........................ 117/2

FOREIGN PATENT DOCUMENTS

| JP | 02-032535 | 2/1990 |
| JP | 11-067781 | 3/1999 |
| JP | 11-251322 | 9/1999 |
| JP | 11-302099 | 11/1999 |
| JP | 2000-026196 | 1/2000 |
| JP | 2000-203999 | 7/2000 |

* cited by examiner

Primary Examiner—Felisa Hiteshew
(74) Attorney, Agent, or Firm—Hogan & Hartson LLP

(57) ABSTRACT

According to the present invention, there are provided a method for producing a silicon single crystal wafer which contains oxygen induced defects by subjecting a silicon single crystal wafer containing interstitial oxygen to a heat treatment wherein the heat treatment includes at least a step of performing a heat treatment using a resistance-heating type heat treatment furnace and a step of performing a heat treatment using a rapid heating and rapid cooling apparatus, and a silicon single crystal wafer produced by the method. There can be provided a method for producing a silicon single crystal wafer which has a DZ layer of higher quality compared with a conventional wafer in a wafer surface layer part and has oxygen induced defects at a sufficient density in a bulk part and the silicon single crystal wafer.

16 Claims, 1 Drawing Sheet

METHOD FOR MANUFACTURING SINGLE-CRYSTAL-SILICON WAFERS

TECHNICAL FIELD

The present invention relates to a method for producing a silicon single crystal wafer which has a defect-free layer (DZ layer, Denuded Zone) in a surface layer part, and has sufficient gettering sites in a bulk part.

BACKGROUND ART

It is required for a silicon single crystal in the light of characteristics of a device that a surface layer part which serves as an active layer of device has no crystal defects. Furthermore, there is required a wafer (IG wafer) having a high intrinsic gettering (IG) effect which has gettering sites for heavy metal contamination in a bulk part of the wafer, since there exists in a process for fabricating a device a process wherein heavy metal contamination which degrades device characteristics is easily caused.

As a method for forming oxide precipitates or crystal defects such as dislocations and stacking faults resulting from them (hereinafter referred to as oxygen induced defects) in a wafer, there is known, for example, a method wherein a CZ silicon single crystal wafer which is produced by Czochralski (CZ) method and contains interstitial oxygens at a certain concentration is subjected to a multi-stage IG heat treatment (for example, a three stage heat treatment of high temperature, low temperature and medium temperature, or the like) to form a DZ layer in the surface layer part and form oxygen induced defects in the bulk part.

However, if an IG wafer having high IG ability is produced according to such a method, there is a disadvantage that the oxygen induced defects tend to be increased also in the surface layer part used serving as a device active layer. This is because, the IG ability is greatly dependent on the amount of oxide precipitates (a density of oxide precipitates) in the wafer, and thus there has been employed as the easiest method of improving it, a method in which concentration of interstitial oxygen contained in the silicon wafer to be subjected to IG heat treatment is increased, but at the same time increase of oxide precipitates in a surface layer part of the wafer are also caused. Moreover, in the case that heat treatment is performed for a long time in order to induce crystal defects at a high density inside, oxygen induced defects which exists inside are significantly grown with the prolonged heat treatment, which may reach the device active region in some cases.

Furthermore, as a grown-in defect formed in a CZ wafer during crystal growth according to Czochralski method, it is known that in addition to a minute oxide precipitates, a void type crystal defect (hereinafter referred to as a void defect (referred to also as COP)) which is considered to be an agglomerations of vacancies is existed. And, it is known that the void defects remain in a DZ layer of a conventional IG wafer. That is, even in a DZ layer (a defect-free layer), defects actually eliminated (reduced) are the defects due to oxide precipitates, and such void defects are not reduced.

It has been required that the wafer having an excellent gettering ability wherein no crystal defects exist in a region to a certain depth from a surface and sufficient gettering sites such as a oxide precipitates exist in a region deeper than a certain depth is produced efficiently. The reason for needing the excellent gettering ability is that the influence of a heavy metal impurity is one of the causes of reducing the yield in a device process, and that insufficient formation of gettering sites such as oxide precipitates in a wafer causes shortage of gettering, and thus heavy metal is captured in the device active layer to cause degradation of device characteristics such as increase in a leakage current.

Of course, the best way is to keep cleanliness in all the steps of a device process, but it is actually impossible to prevent a wafer completely from suffering from heavy metal contamination or the like. Therefore, it is desired that the oxygen induced defects serving as gettering sites are formed sufficiently inside a wafer. On the other hand, as for the surface layer part serving as a device active layer, it is desired that the region having neither oxide precipitate nor crystal defect such as a void defect exist to a sufficient depth.

DISCLOSURE OF THE INVENTION

The main object of the present invention is to provide a method for producing a silicon single crystal wafer which has a DZ layer of higher quality compared with a conventional wafer in a wafer surface layer part and has oxygen induced defects at a sufficient density in a bulk part.

In order to achieve the above-mentioned object, a method for producing a silicon single crystal wafer of the present invention is a method for producing a silicon single crystal wafer which contains oxygen induced defects by subjecting a silicon single crystal wafer containing interstitial oxygen to a heat treatment wherein the heat treatment includes at least a step of performing a heat treatment using a resistance-heating type heat treatment furnace and a step of performing a heat treatment using a rapid heating and rapid cooling apparatus.

As described above, according to the present invention, as a precipitation heat treatment for forming gettering sites such as oxide precipitates or the like in a bulk part and a heat treatment for eliminating void defects in the surface of a wafer, there are conducted both a heat treatment using a resistance-heating type heat treatment furnace (it is a so-called batch processing furnace in which a treatment of two or more wafers can be performed at the same time, generally there are a vertical-type furnace and a horizontal-type furnace) and a heat treatment using a rapid heating and rapid cooling apparatus (it is usually a single wafer processing apparatus, and is a so-called RTA (Rapid Thermal Annealing) apparatus in which it is possible to increase and decrease a temperature to the target temperature in several seconds to several tens of seconds, and a lamp heating type apparatus using an infrared lamp is often employed). By combining the heat treatments by these apparatuses, there can be achieved the effect that generation of oxygen induced defects is promoted and the region where the void defects are reduced (hereinafter occasionally referred to as a void-free region) is enlarged.

In that case, it is preferable that the heat treatment using the resistance-heating type heat treatment furnace is performed at 1000 to 1300° C. for 10 to 300 minutes, and the heat treatment using the rapid heating and rapid cooling apparatus is performed at 1000 to 1350° C. for 1 to 300 seconds.

This is the suitable range of the heat treatment conditions set for both of the apparatuses used for the heat treatment of the present invention. If it is performed at a lower temperature for a shorter period than the aforementioned range, the effects of promoting oxygen induced defects and enlarging the void-free region becomes insufficient. On the contrary, if it is performed at a higher temperature for a longer period, cost may be increased for the reason that degradation of device characteristics due to heavy metal contamination becomes remarkable, a problem arises in a durability of the apparatus due to increase of load on the apparatus, throughput is reduced and the like, and thus it is not practical.

In this case, it is preferable to use as the silicon single crystal wafer to be subjected to the heat treatment, a silicon single crystal wafer which is doped with nitrogen at a concentration in the range of $1 \times 10^{10}$ to $5 \times 10^{15}$ number/cm$^3$.

If it is doped with nitrogen, although a density of grown-in defects is increased, a size of them becomes small. Therefore, by performing the heat treatment, the grown-in defects in a surface layer part can be eliminated efficiently, and a high density of oxide precipitates can be obtained in a bulk part. If nitrogen concentration is lower than the lower limit, the above-mentioned effect of nitrogen doping can not be fully achieved. If nitrogen concentration is higher than the upper limit, formation of a single crystal is inhibited when the crystal is grown In addition, it is preferable to use the silicon single crystal wafer which is doped with carbon at a concentration in the range of 0.1 to 5 ppma as the silicon single crystal wafer to be subjected to the heat treatment.

As described above, oxygen precipitation can be promoted also by doping with carbon, and the concentration of 0.1 ppma or more is needed in order to obtain the effect. If it is more than 5 ppma, formation of a single crystal is inhibited when the single crystal is grown as in the case of nitrogen doping.

According to the present invention, there is provided a silicon single crystal wafer having a defect-free layer in which there exist neither oxygen induced defect nor crystal defect such as a void defect in a surface layer part, and having sufficient gettering sites in a bulk part which is produced by the above-mentioned production method.

According to the present invention, there can be produced a silicon single crystal wafer which has a DZ layer of a higher quality than the conventional wafer in a surface layer part of the wafer, contains a sufficient density of oxide precipitates in a bulk part, and has a high gettering ability.

BEST MODE FOR CARRYING OUT THE INVENTION

Figure 1:
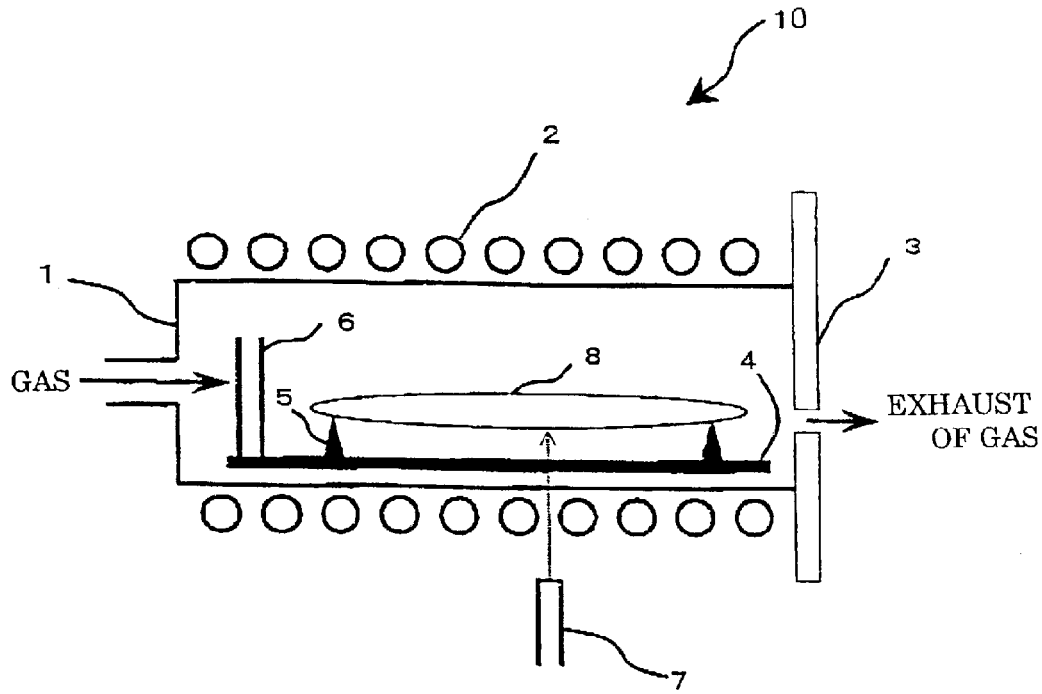
FIG. 1 is a schematic view showing one example of the rapid heating and rapid cooling apparatus (RTA apparatus) used in the present invention.

The present invention will be explained in detail below.

The inventors of the present invention have studied further and made experiments in relation to production of a silicon single crystal wafer which has a DZ layer in which there is no crystal defect in a surface layer part, and has a sufficient density of gettering sites, such as oxide precipitates in a bulk part. As a result, they have found that the above-mentioned object can be achieved by performing a heat treatment in two steps at least using a resistance-heating type heat treatment furnace and a rapid heating and rapid cooling apparatus. They have then studied the conditions therefor, and thereby have completed the present invention.

As described above, the heat treatment of the present invention needs to be performed in two steps at least using the resistance-heating type heat treatment furnace and the rapid heating and rapid cooling apparatus, and in regard to the heat treatment conditions of the heat treatment apparatuses, it has been found that the heat treatment may be conducted under the following heat treatment conditions depending on types of heat treatment apparatuses from results of various experiments.

The heat treatment using the resistance-heating type heat treatment furnace is preferably conducted at 1000–1300° C. for 10–300 minutes. Furthermore, in order to eliminate efficiently grown-in defects in the surface layer part of the wafer under these conditions, the heat treatment is preferably conducted at 1100° C. or more for one hour or more. For the heat treatment atmosphere, a hydrogen atmosphere, an inert gas atmosphere such as argon atmosphere and the like, or an atmosphere of a mixture of these gases is suitable.

Moreover, if oxidation heat treatment is performed continuously after this heat treatment, the inner wall oxide film of a void defect is eliminated by out-diffusion in the heat treatment at the former step, and then, void defects are eliminated efficiently by injecting of the interstitial silicon in the subsequent oxidation, and thus a void-free region can be formed more deeply.

The heat treatment using the rapid heating and rapid cooling apparatus (RTA apparatus) is performed at 1000 to 1350° C. for 1 to 300 seconds. Thereby, the void defects near the most external surface of the wafer (referred to also as COP) can be removed efficiently, and at the same time, the effect of increasing the internal oxygen induced defects can be achieved. In order to achieve these effects further efficiently, the heat treatment at 1200° C. or more for about 30 to 60 seconds is suitable. Moreover, in order to increase oxygen induced defects, nitrogen atmosphere, oxygen atmosphere, or an atmosphere of a mixture of these gases, in which vacancies and interstitial silicon atoms are injected is suitable for the heat treatment atmosphere.

The order of the heat treatment steps using these two kinds of heat treatment apparatuses is not limited specially. Moreover, it is also possible to repeat these heat treatment steps two or more times. However, taking into consideration a production cost of a silicon wafer, it is preferable to perform each step only one time. Moreover, the same effect can be achieved, even if these heat treatments are added during a process of fabricating a device, or performed also as the heat treatment in the process of fabricating a device.

On the other hand, it is necessary that the wafer used in the present invention (the wafer to be subjected to heat treatment) is a silicon single crystal wafer which contains interstitial oxygen in such an amount that oxide precipitates can be formed in a bulk part after the heat treatment. If it is a usual CZ wafer or a so-called MCZ wafer which is pulled with applying a magnetic field thereto, several ppma to 30 ppma (JEIDA (Japan Electronic Industry Development Association) standard) of interstitial oxygen can be contained. However, in order to obtain the oxide precipitates at a sufficient density after the heat treatment, 15 to 25 ppma is preferable.

Moreover, it is suitable to use the silicon single crystal wafer which is doped with nitrogen and carbon, since there can be achieved effects such as of promoting oxygen precipitation, and of making a size of a grown-in defect small to be eliminated easily by the heat treatment.

As for nitrogen concentration, it is preferable to use a silicon single crystal wafer which is doped with nitrogen in the concentration range of $1 \times 10^{10}$ to $5 \times 10^{15}$ number/cm$^3$. If it is doped with nitrogen, although a density of a grown-in defect is increased, a size thereof becomes small.

Accordingly, when the heat treatment is performed, the grown-in defects in a surface layer part can be efficiently eliminated, and a high density of oxide precipitates can be obtained in a bulk part. If the nitrogen concentration is less than $1 \times 10^{10}$ number/cm$^3$ which is a lower limit, the above-mentioned effect by nitrogen doping can not be obtained sufficiently. If it is higher than $5 \times 10^{15}$ number/cm$^3$ which is an upper limit, formation of single crystal is inhibited at the time of growth of crystal, and therefore it is not desirable.

On the other hand, as for carbon concentration, it is preferable to use the silicon single crystal wafer which is doped with carbon in the range of 0.1 to 5 ppma. Oxygen precipitation can be promoted also by doping with carbon, and the concentration of 0.1 ppma or more is necessary in order to achieve the effect. If it is higher than 5 ppma, formation of single crystal is inhibited at the time of growth of a single crystal, as in the case of nitrogen doping, and therefore it is not desirable.

In order to produce the silicon single crystal wafer which is doped with nitrogen or carbon at a predetermined concentration, there can be used a method, such as a method of charging a predetermined amount of the silicon wafer with a nitride film into a quartz crucible for melting a raw material silicon, bringing a carbon rod into contact with the silicon melt in a predetermined area for predetermined time, or the like, when the usual CZ single crystal is pulled. And, the concentrations can be controlled suitably by calculating taking into consideration a segregation coefficient of each element.

The resistance-heating type heat treatment furnace for the silicon single crystal wafer used in the present invention is a so-called batch processing furnace in which a treatment of two or more wafers can be performed at a time, and generally there are a vertical-type furnace and a horizontal-type furnace. An example of a horizontal type batch processing furnace may include an apparatus such as UL-260-10H manufactured by Tokyo Electron Limited. They are furnaces used quite popularly. In the present invention, the heat treatment can be conducted using a furnace which has been used generally.

The rapid heating and rapid cooling apparatus is usually a single wafer processing apparatus, and is a so-called RTA (Rapid Thermal Annealing) apparatus in which it is possible to increase and decrease a temperature to an intended temperature in several seconds to about several tens of seconds. Examples of them include an apparatus wherein the lamp heating type using the infrared lamp is employed. Moreover, an example of a commercially available apparatus may include an apparatus SHS-2800 manufactured by Steag MicroTech International. They are neither extraordinarily complicated nor expensive.

An example of the rapid heating and rapid cooling apparatus for the silicon single crystal wafer used in the present invention will be shown below. FIG. 1 is a schematic view of a RTA apparatus.

The heat treatment apparatus 10 shown in FIG. 1 has a chamber 1 made of quartz, and a wafer is subjected to heat treatment within this chamber 1. Heating is performed by heating lamps 2 arranged so that a chamber 1 may be surrounded from the directions of up, down, left and light. The electric power supplied to each of the lamps can be controlled independently.

An automatic shutter 3 is provided at the gas exhausting side, and it shuts the outer air. The automatic shutter 3 has a wafer insertion port not shown in the figure, which can be opened and closed by a gate valve. The automatic shutter 3 is also provided with a gas exhausting outlet, and thereby the atmosphere in the furnace can be controlled.

The wafer 8 is placed on a three-point supporting part 5 formed on a quartz tray 4. A buffer 6 made of quartz is provided at the gas inlet side of the tray 4, and it can prevent the wafer from being directly blown by the introduced gas flow.

Further, the chamber 1 is provided with a special window for temperature measurement, which is not shown in the figure, and the temperature of the wafer 8 can be measured by a pyrometer 7 installed in the outside of the chamber 1 through the special window.

By using the heat treatment apparatus 10 mentioned above, the heat treatment for rapid heating and rapid cooling of wafer is performed as follows.

First, the wafer 8 is loaded into the chamber 1 from the insertion port and placed on the tray 4 by a wafer handling apparatus, which is installed at a position adjacent to the heat treatment apparatus 10 but not shown in the figure. Then, the automatic shutter 3 is closed.

The inside of the chamber 1 is sufficiently purged with nitrogen gas, and then the atmospheric gas is changed to hydrogen, argon or a mixed gas of nitrogen, oxygen and the like. Subsequently, electric power is supplied to the heating lamps 2 to heat the wafer 8 to a predetermined temperature, for example, 1000 to 1350° C. In this operation, it takes, for example, about 30 seconds to attain the desired temperature. Then, the wafer 8 is kept at the temperature for a predetermined period of time, and thus the wafer 8 can be subjected to a high temperature heat treatment. When the predetermined time has passed and the high temperature heat treatment was finished, output of the lamps is reduced to lower the temperature of the wafer. This temperature decrease can also be attained during a period of, for example, about 30 seconds. Finally, the wafer is unloaded by the wafer handling apparatus to finish the heat treatment.

When other wafers are further subjected to the heat treatment, the wafers can be successively loaded to continuously perform the RTA treatment. When the thermal oxidation treatment is performed by using an RTA apparatus, the treatment temperature, treatment gas atmosphere and the like can be changed.

The present invention will be explained concretely hereafter with the Examples of the present invention and Comparative Examples. However, the present invention is not limited to these.

EXAMPLE 1, EXAMPLE 2, COMPARATIVE EXAMPLES 1–4

The following two kinds of CZ silicon wafers (A, B) were produced, and the following experiments were conducted using them.

Example 1: Wafer A: A diameter of 150 mm, a conductivity type of p type, crystal orientation of <100>, a resistivity of 10 Ω·cm, nitrogen concentration of $1.0 \times 10^{13}$ number/cm$^3$ (a calculated value), oxygen concentration of 15 ppma (JEIDA (Japan Electronic Industry Development Association) standard).

Example 2: Wafer B: A diameter of 150 mm, a conductivity type of p type, crystal orientation of <100>, a resistivity of 10 Ω·cm, non doping with nitrogen, oxygen concentration of 15 ppma (JEIDA).

First, these wafers were subjected to heat treatment with a horizontal-type batch processing furnace (manufactured by Tokyo Electron Limited, UL-260-10H) after subjecting them to standard cleaning (SC-1, SC-2, SC-1). The heat treatment is performed on the condition that at 1150° C., for 4 hours, and in argon atmosphere (Ar 100%). After the wafer was unloaded, it was subjected to the heat treatment using a RTA apparatus (Steag MicroTech International, SHS-2800 type), at 1200° C., for 30 seconds in a mixed gas atmosphere of nitrogen and oxygen. Then, in order to elicit oxide precipitates, it was subjected to the heat treatment at 800° C. for 4 hours and at 1000° C. for 16 hours in nitrogen atmosphere, and a density of the oxide precipitates in a bulk part and a width of the DZ layer were measured.

For comparison, there were also evaluated the wafers that subjected only to the heat treatment using a horizontal-type batch processing furnace of the above-mentioned heat treatments (Comparative Example 1: the wafer A, the Comparative Example 3: the wafer B), and the wafers that not subjected to any of the heat treatments (Comparative Example 2: the wafer A, Comparative Example 4: the wafer B).

A density of oxide precipitates was measured according to the OPP (Optical Precipitate Profiler) method. A width of the DZ layer was measured by conducting an angle-polishing from the wafer surface, subjecting the angle-polished face to preferential etching (Secco etching), and making an observation with an optical microscope. Therefore, a measured width of the DZ layer is not a value which shows a void-free region.

The conditions of the heat treatment described above and the results were shown in Table 1.

TABLE 1

| Example No. | Kind of wafer | Heat Treatment Step | Density of oxide precipitate (counts/cm$^3$) | Width of DZ layer ($\mu$m) |
|---|---|---|---|---|
| Example 1 | A | Horizontal-type furnace + RTA | 5.1 × 10$^9$ | 35 |
| Comparative Example 1 | A | Only horizontal-type furnace | 6.3 × 10$^8$ | 65 |
| Comparative Example 2 | A | Nothing | 1.0 × 10$^7$ | Measurement impossible |
| Example 2 | B | Horizontal-type furnace + RTA | 1.0 × 10$^8$ | Measurement impossible |
| Comparative Example 3 | B | Only horizontal-type furnace | 1.0 × 10$^7$ | Measurement impossible |
| Comparative Example 4 | B | Nothing | 1.0 × 10$^7$ | Measurement impossible |

Note:
Wafer A: nitrogen concentration: 1.0 × 10$^{13}$ atoms/cm$^3$, oxygen concentration: 15 ppma.
Wafer B: Nitrogen concentration: Non doping, oxygen concentration: 15 ppma.

It has been turned out from these results that in the case that the wafer A sliced from the crystal which is doped with nitrogen is subjected to the heat treatment, there exist more oxide precipitates as compared with the wafer B which is not doped with nitrogen, and that oxide precipitates are increased by further subjecting to the RTA treatment.

In addition, 65 $\mu$m of the DZ layer of oxide precipitates existed in the wafer A (Comparative Example 1) which was subjected only to the heat treatment using a horizontal-type batch processing furnace, whereas 35 $\mu$m of the DZ layer existed in the wafer A (Example 1) which was subjected to RTA treatment additionally. This shows that a width of the DZ layer got narrow, as a result that oxygen precipitation was promoted by the RTA treatment. It is likely to be thought that it is a disadvantageous effect apparently that a width of the DZ layer became narrow. However, since the width demanded as a part to be a device active region is at most about 10 $\mu$m, 35 $\mu$m of the DZ layers is sufficient. On the contrary, since the density of oxide precipitates is increased one digit, the gettering ability is improved, and such an effect is more important. On the other hand, a width of the DZ layer of the wafer B which is not doped with nitrogen (Example 2, Comparative Examples 3 and 4) was not able to be measured clearly, since a density of oxide precipitates was low. Similarly, a width of the DZ layer of the wafer A (Comparative Example 2) which was not subjected to the heat treatment steps could not been measured.

Furthermore, the crystal defects in the bulk part of the nitrogen doped wafer A were observed with TEM (a transmission electron microscope), and thereby it was confirmed that dislocations were generated by the RTA treatment. These dislocations act effectively for gettering.

EXAMPLE 3, EXAMPLE 4

In order to confirm the effect on the void-free region of the RTA heat treatment in addition to the heat treatment with a resistance-heating type heat treatment furnace, the following two kinds of CZ silicon wafers (C, D) were produced, and the following experiments were conducted using them.

Example 3: Wafer C: a diameter of 150 mm, a conductivity type of p type, crystal orientation of <100>, a resistivity of 10 $\Omega$·cm, nitrogen concentration of 1.0×10$^{13}$ number/cm$^3$ (a calculated value), oxygen concentration of 13 ppma (JEIDA).

Example 4: Wafer D: a diameter of 150 mm, a conductivity type of p type, crystal orientation of <100>, a resistivity of 10 $\Omega$·cm, nitrogen concentration of 1.0×10$^{13}$ number/cm$^3$ (a calculated value), oxygen concentration of 15 ppma (JEIDA).

First, these wafers were subjected to heat treatment with the horizontal-type batch processing furnace (manufactured by Tokyo Electron Limited, UL-260-10H) after subjecting them to standard cleaning (SC-1, SC-2, SC-1). The heat treatment was performed on the condition that at 1200° C., for one hour, in argon atmosphere (Ar 100%). After the wafer was unloaded, it was subjected to the heat treatment using a RTA apparatus (Steag MicroTech International, SHS-2800 type), at 1200° C., for 30 seconds (in a mixed gas atmosphere of nitrogen and oxygen). For comparison, the wafers C (Comparative Example 5) and the wafers D (Comparative Example 6) which are not subjected to the RTA heat treatment (subjected only to the heat treatment at 1200° C., for one hour, in Ar) were also produced.

Then, the wafers thus produced were polished to the predetermined depth from a surface, and oxide dielectric breakdown voltage characteristics [TZDB (Time Zero Dielectric Breakdown) good chip yield] in each depth was measured. The TZDB good chip yield has a good correlation with a void defect (COP). It is known that an good chip yield is reduced if there are many void defects.

In measurement of the TZDB good chip yield, the good chip yield was calculated by forming a 25 nm of thermal oxide film on a surface of the wafer, forming further a polysilicon electrode which was doped with phosphorus (P) (electrode area of 8 mm$^2$) thereon, and determining those showing dielectric breakdown electric field of 8 MV/cm or more at a current density in decision of 1 mA/cm$^2$ as good chips at 100 points in a plane of the wafer. The results were shown in FIG. 2.

Figure 2:
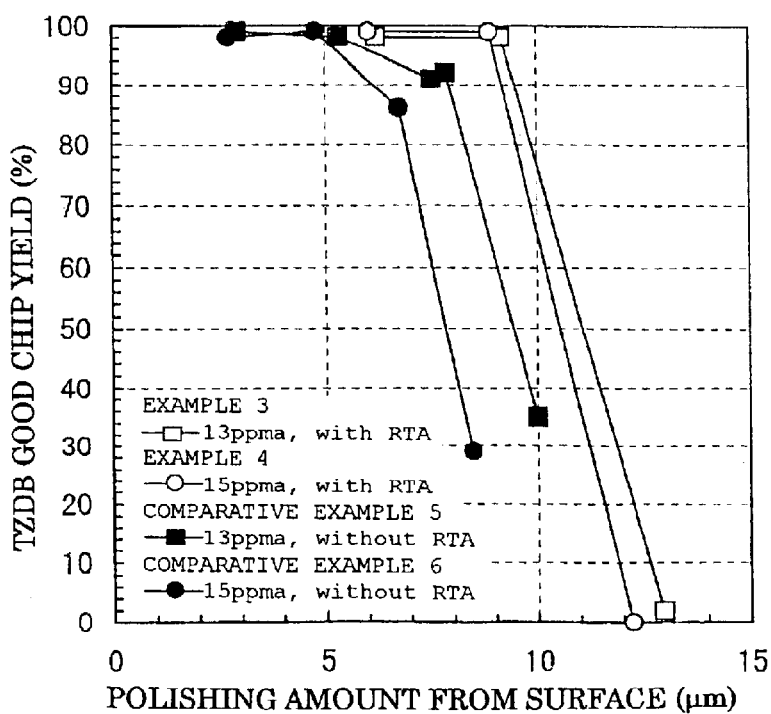
FIG. 2 is a graph showing a result of the relation between a polishing amount from the wafer surface and a TZDB good chip yield in Examples 3 and 4 and Comparative Examples 5 and 6.

As shown in FIG. 2, it has been turned out that, in both wafers having initial oxygen concentration of 13 ppma and 15 ppma, the depth at which a TZDB good chip yield is reduced becomes deeper, namely the void-free region spreads more deeply, by being subjected to the RTA heat treatment.

Although it is not known exactly why a void-free region spreads by being subjected to the RTA heat treatment, it is concluded that by adding the RTA heat treatment to the heat treatment with a resistance-heating type heat treatment furnace, the void-free region is expanded, and moreover, increase of a density of oxide precipitates and generation of defects such as dislocation are promoted from the results of Example 1 and Example 2. Therefore, it has been found out that improvement in a quality of the DZ layer and improvement in gettering ability can be achieved simultaneously.

The present invention is not limited to the above-described embodiment. The above-described embodiment is a mere example, and those having the substantially same structure as that described in the appended claims and providing the similar action and effects are included in the scope of the present invention.

For example, in the above-described embodiment, it is exemplified that the silicon single crystal wafer having a diameter of 6 inches was subjected to the heat treatment. However, the present invention is not limited thereto, and can be applied to a silicon single crystal wafer having a diameter of 8 to 16 inches, or more.

Furthermore, the present invention can also be applied to a silicon single crystal wafer, irrespective of a method by which the crystal is produced, whether it is CZ method, MCZ method or any other methods.

What is claimed is:

1. A method for producing a silicon single crystal wafer which contains oxygen induced defects by subjecting a silicon single crystal wafer containing interstitial oxygen to a heat treatment wherein the heat treatment includes at least a step of performing a heat treatment in a hydrogen atmosphere, an inert gas atmosphere or an atmosphere of a mixture of these gases using a resistance-heating heat treatment furnace and a step of performing a heat treatment using a rapid heating and rapid cooling apparatus.

2. The method for producing a silicon single crystal wafer according to claim 1 wherein the heat treatment using the resistance-heating heat treatment furnace is performed at 1000 to 1300° C. for 10 to 300 minutes, and the heat treatment using the rapid heating and rapid cooling apparatus is performed at 1000 to 1350° C. for 1 to 300 seconds.

3. The method for producing a silicon single crystal wafer according to claim 2 wherein a silicon single crystal wafer which is doped with nitrogen at a concentration in the range of $1 \times 10^{10}$ to $5 \times 10^{15}$ number/cm$^3$ is used as the silicon single crystal wafer to be subjected to the heat treatment.

4. The method for producing a silicon single crystal wafer according to claim 3 wherein a silicon single crystal wafer which is doped with carbon at a concentration in the range of 0.1 to 5 ppma is used as the silicon single crystal wafer to be subjected to the heat treatment.

5. A silicon single crystal wafer produced by the method for producing a silicon single crystal wafer according to claim 4.

6. A silicon single crystal wafer produced by the method for producing a silicon single crystal wafer according to claim 3.

7. The method for producing a silicon single crystal wafer according to claim 2 wherein a silicon single crystal wafer which is doped with carbon at a concentration in the range of 0.1 to 5 ppma is used as the silicon single crystal wafer to be subjected to the heat treatment.

8. A silicon single crystal wafer produced by the method for producing a silicon single crystal wafer according to claim 7.

9. A silicon single crystal wafer produced by the method for producing a silicon single crystal wafer according to claim 2.

10. The method for producing a silicon single crystal wafer according to claim 1 wherein a silicon single crystal wafer which is doped with nitrogen at a concentration in the range of $1 \times 10^{10}$ to $5 \times 10^{15}$ number/cm$^3$ is used as the silicon single crystal wafer to be subjected to the heat treatment.

11. The method for producing a silicon single crystal wafer according to claim 10 wherein a silicon single crystal wafer which is doped with carbon at a concentration in the range of 0.1 to 5 ppma is used as the silicon single crystal wafer to be subjected to the heat treatment.

12. A silicon single crystal wafer produced by the method for producing a silicon single crystal wafer according to claim 11.

13. A silicon single crystal wafer produced by the method for producing a silicon single crystal wafer according to claim 10.

14. The method for producing a silicon single crystal wafer according to claim 1 wherein a silicon single crystal wafer which is doped with carbon at a concentration in the range of 0.1 to 5 ppma is used as the silicon single crystal wafer to be subjected to the heat treatment.

15. A silicon single crystal wafer produced by the method for producing a silicon single crystal wafer according to claim 14.

16. A silicon single crystal wafer produced by the method for producing a silicon single crystal wafer according to claim 1.

* * * * *